United States Patent
Wilkins (10) Patent No.: US 9,456,507 B2
(45) Date of Patent: Sep. 27, 2016

(54) ECOLOGICAL METHOD FOR CONSTRUCTING CIRCUIT BOARDS

(71) Applicant: The Boeing Company, Chicago, IL (US)

(72) Inventor: Donald F. Wilkins, O'Fallon, MO (US)

(73) Assignee: The Boeing Company, Chicago, IL (US)

(*) Notice: Subject to any disclaimer, the term of this patent is extended or adjusted under 35 U.S.C. 154(b) by 99 days.

(21) Appl. No.: 14/047,323

(22) Filed: Oct. 7, 2013

(65) Prior Publication Data
US 2015/0096788 A1 Apr. 9, 2015

(51) Int. Cl.
*H05K 3/44* (2006.01)
*H05K 3/46* (2006.01)
*H05K 1/02* (2006.01)
*H05K 1/09* (2006.01)
*B29C 70/88* (2006.01)
*B29C 35/02* (2006.01)
*H05K 3/10* (2006.01)
*H05K 3/00* (2006.01)

(52) U.S. Cl.
CPC .......... *H05K 3/4673* (2013.01); *B29C 35/0261* (2013.01); *B29C 70/882* (2013.01); *H05K 1/0298* (2013.01); *H05K 1/092* (2013.01); *H05K 3/101* (2013.01); *H05K 3/4676* (2013.01); *B29K 2995/0005* (2013.01); *H05K 3/0005* (2013.01); *H05K 3/4644* (2013.01); *H05K 2201/09118* (2013.01); *H05K 2203/0113* (2013.01); *Y10T 29/49155* (2015.01); *Y10T 29/49163* (2015.01); *Y10T 29/532* (2015.01)

(58) Field of Classification Search
CPC ............ H05K 3/4673; H05K 3/4676; H05K 1/0298; H05K 1/093; B29K 2995/0005; B29C 35/0261; B29C 70/882; Y10T 29/49155; Y10T 29/49163

See application file for complete search history.

(56) References Cited

U.S. PATENT DOCUMENTS 4,085,285 A * 4/1978 Lippits et al. ................ 174/259
5,284,695 A * 2/1994 Barlow et al. ................ 264/497

OTHER PUBLICATIONS

Kayser, Markus; "Solar Sinter", http://www.markuskayser.com/work/solarsinter/, 2011.

* cited by examiner

*Primary Examiner* — Peter DungBa Vo
*Assistant Examiner* — Jeffrey T Carley
(74) *Attorney, Agent, or Firm* — Felix L. Fischer (57) ABSTRACT

A method for fabrication of a circuit board using the disclosed embodiments relies on a CAD model of a multi-layer circuit board with conductive elements defined by layer. A first granular conductive material layer is introduced into a mold. A fusion process element traverses across the mold to fuse selected portions of the first granular conductive material layer forming first layer conductive elements. An additional granular conductive material layer is introduced into the mold over the fused selected portions of the first layer and unfused portions of the first layer. The fusion process element is then traversed across the mold to fuse selected portions of the additional granular conductive material layer forming an additional layer of conductive elements. Unfused granular conductive material is then purged from the fused first conductive elements and additional conductive layer elements. A dielectric material is then infused into a structure formed by the fused first conductive elements and additional conductive layer elements.

6 Claims, 7 Drawing Sheets

ECOLOGICAL METHOD FOR CONSTRUCTING CIRCUIT BOARDS

BACKGROUND INFORMATION

1. Field

Embodiments of the disclosure relate generally to the field of electrical circuit boards and more particularly to a method for producing multilayer circuit boards by printing of multiple layers of conductive elements.

2. Background

The manufacture of circuit boards is a complex process involving chemical depositions, etchings and mechanical drilling. The process uses toxic chemicals and produces hazardous waste. Safe utilization of the chemicals and disposal of the waste adds to the cost of production. The number of manufacturers qualified to use these processes are limited and their number is declining. Plating and etching layers onto the dielectric base material is a matter of complex chemistries. Finding the appropriate combination of compatible materials which provide the necessary electrical properties can in a design process with extended timeframes.

It is therefore desirable to provide a process for manufacturing multilayer printed circuit boards employing ecologically friendly methods with minimized chemicals usage.

SUMMARY

Embodiments disclosed herein provide a system for fabrication of a circuit board employing a computer aided design (CAD) database incorporating a 3D model of a circuit board. A mold receives granular conductive material and a metal fusion process element translatable across the mold is activated responsive to the CAD database for fusing selected portions of granular conductive material to form conductive elements. A dispensing hopper delivers granular conductive material into the mold in defined layers for fusion of selected portions of the granular conductive material into conductive elements.

A method for fabrication of a circuit board using the disclosed embodiments relies on a CAD model of a multilayer circuit board with conductive elements defined by layer. A first granular conductive material layer is introduced into a mold. A fusion process element traverses across the mold to fuse selected portions of the first granular conductive material layer forming first layer conductive elements. An additional granular conductive material layer is introduced into the mold over the fused selected portions of the first layer and unfused portions of the first layer. The fusion process element is then traversed across the mold to fuse selected portions of the additional granular conductive material layer forming an additional layer of conductive elements. Unfused granular conductive material is then purged from the fused first conductive elements and additional conductive layer elements. A dielectric material is then infused into a structure formed by the fused first conductive elements and additional conductive layer elements.

A circuit board created employing the embodiments and methods herein provides a plurality of fused, granular conductive material layers oriented to form a structure that defines multiple layers of conductive paths and a plurality of conductors between the paths according to a circuit board model. A dielectric material is infused between the multiple conductive path layers and about the conductors to provide support for the fused material layers The features, functions, and advantages that have been discussed can be achieved independently in various embodiments of the present disclosure or may be combined in yet other embodiments further details of which can be seen with reference to the following description and drawings.

DETAILED DESCRIPTION

Embodiments disclosed herein provide an additive 3D process to build the conducting surfaces and vias of a multilayer circuit board. In one exemplary embodiment, when this three dimensional structure is completed, an insulating material is flowed into the structure. Once solidified, the insulating material provides structural strength and electrical isolation.

Figure 1:
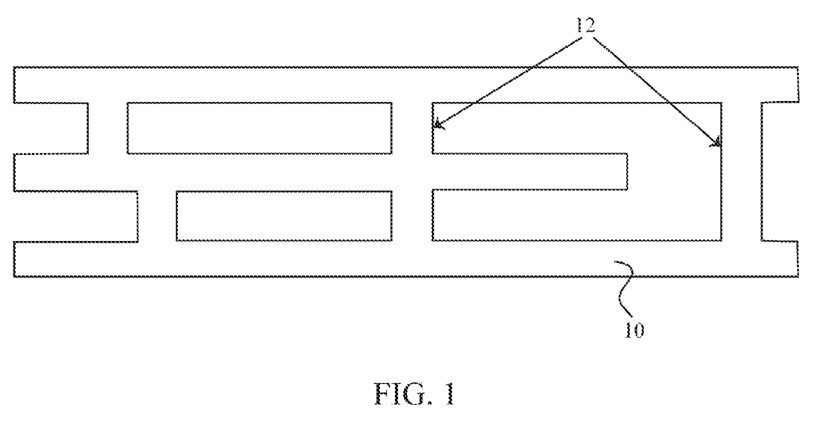
FIG. 1 a side view of a printed circuit board structure showing conductive traces and vias.
Figure 2:
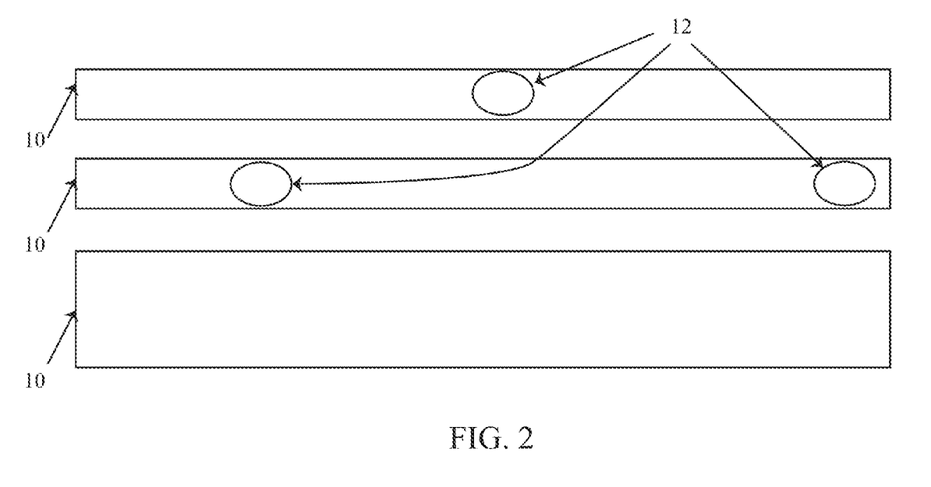
FIG. 2 is a top view of the circuit board structure of FIG. 1.

Referring to the drawings, FIGS. 1 and 2 show a simplified example circuit board structure having conductive traces 10 with vias 12 connecting various traces in the differing layers. As used herein the term "circuit board" covers both the standard definition of a circuit, where an array of components is connected together on a dielectric plane, and a backplane used to connect circuit boards into a system of electronic modules. The simplified example shows only three layers and a limited number of vias while complex circuit boards can have many layers and vias.

A computer aided design (CAD) three dimensional model of a desired multilayer circuit board is employed for definition of the conductive traces, vias and dielectric interlayers.

Figure 3:
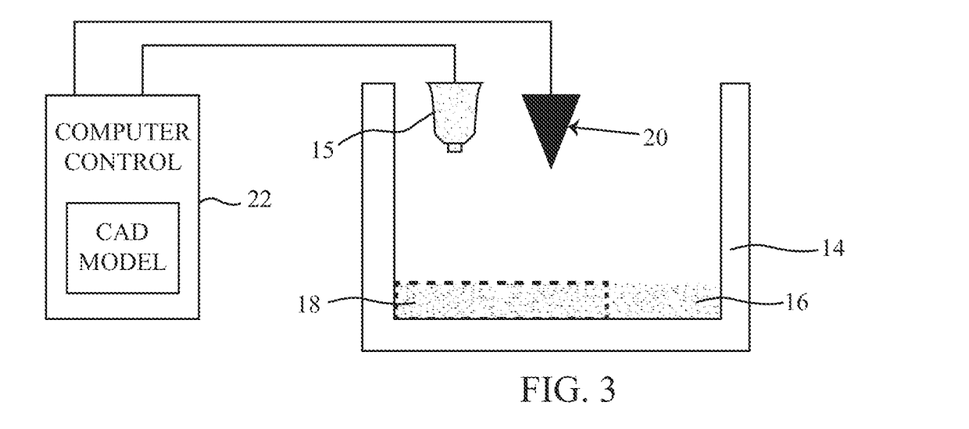
FIG. 3 is a pictorial section view representation of an initial material deposit in a mold for creation of a circuit board layer.
Figure 4:
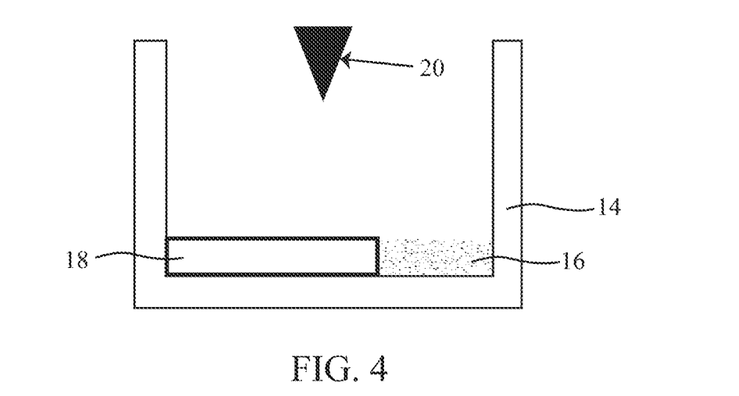
FIG. 4 is a pictorial representation of the first layer as solidified.

FIG. 3 demonstrates an initial step in forming a circuit board according to the present method. A mold or support frame 14, which may have removable elements as described subsequently, is partially filled using a translating hopper 15 with a first layer of granular conductive material 16 from which conductive traces on a first layer of the circuit board will be formed. An initial layout for a first trace 18 is shown in phantom. The granular conductive material may be metallic powder such as copper or other alloys. Silver, aluminum or, in certain embodiments, silica for optical circuits could be employed. A metal fusion process element 20 is employed to fuse portions of the granular conductive material 16 into the first trace 18 in a manner comparable to a three dimensional print head controlled by a computer system 22 responsive to the CAD model of the circuit board layer. The metal fusion process element may employ a laser sintering head, microwave horn, metal sputtering element ultrasound or similar device to fuse portions of the granular conductive material 16 into the first trace 18 leaving the remaining granular conductive material in an unfused state. In certain embodiments adhesives or glues could be employed. As shown in FIG. 4, the unfused granular conductive material 16 remains in the mold 14 and the now fused first trace 18 is supported in the mold.

In certain embodiments, the translating hopper 15 and fusion process element 20 may be coupled with the fusion process element following the translating hopper, both under control of the computer system 22 for traversing the mold area, dispensing and fusing the granular conductive material.

Figure 5:
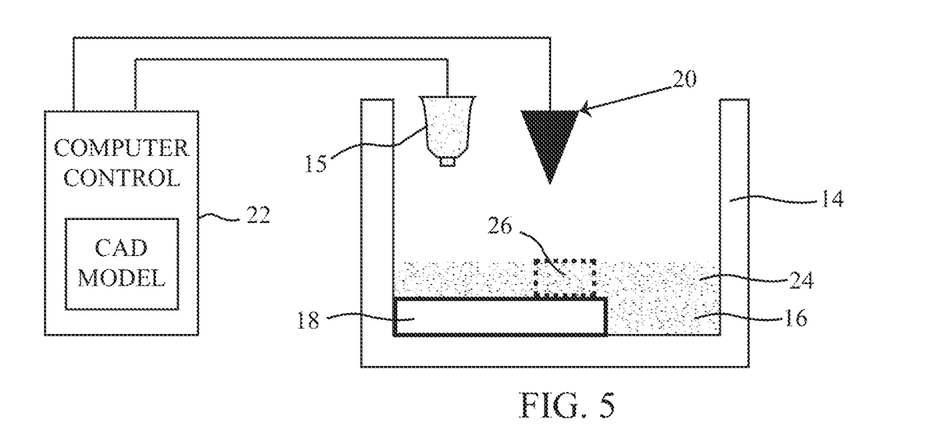
FIG. 5 is a pictorial representation of an material deposit for creation of a circuit board layer with a via.
Figure 6:
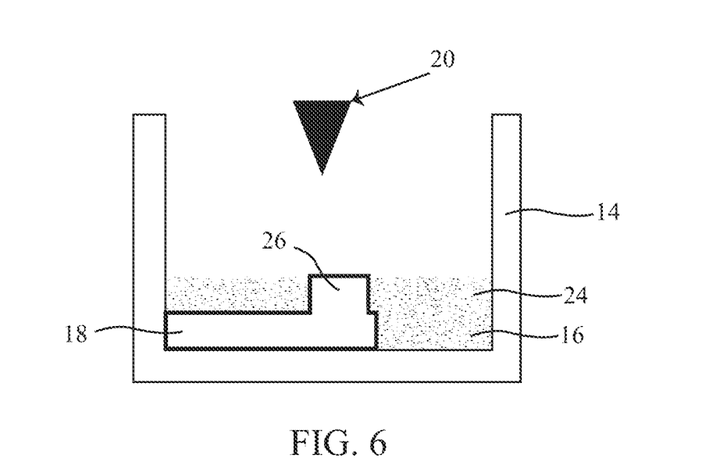
FIG. 6 is a pictorial representation of the via as solidified.

The process is then continued as shown in FIG. 5 by adding a second layer of granular conductive material 24 into the mold 14 for creation of conductive elements in the second layer of the circuit board, via 26 shown in phantom as an example. Under the control of computer system 22, the fusion process element 20 fuses portions of the second layer of granular conductive material 24 to produce conductive elements according to the CAD model for the second layer in the circuit board. Via 26 is fused during the second layer pass as shown in FIG. 6 with remaining portion of the second layer of granular conductive material 24 and first layer of granular conductive material 16 unfused.

Figure 7:
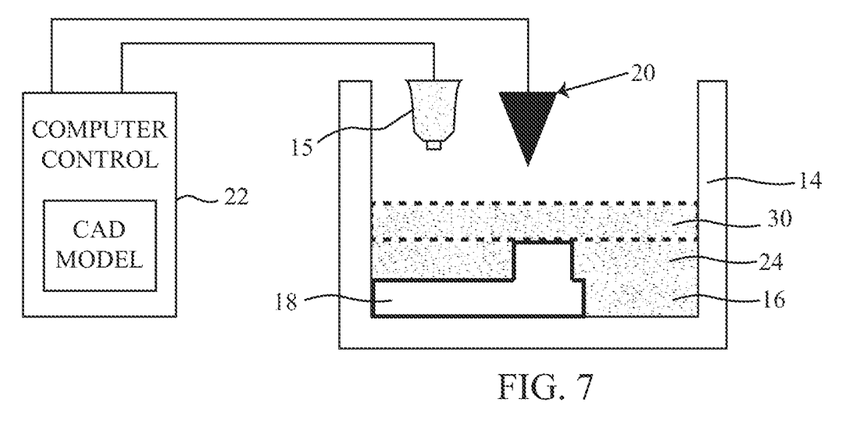
FIG. 7 is a pictorial representation of an initial material deposit for creation of an additional circuit board layer.
Figure 8:
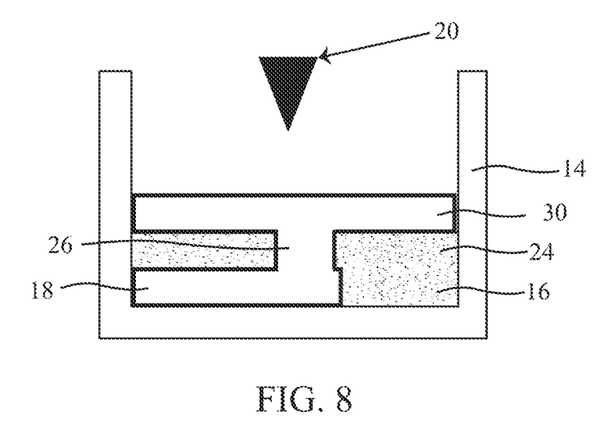
FIG. 8 is a pictorial representation of the additional circuit board layer as solidified.

A third layer of granular conductive material 28 is then introduced into the mold as shown in FIG. 7 for creation of conductive elements in the third layer of the circuit board. A conductive trace 30 is shown as an example. Under the control of computer system 22, the fusion process element 20 fuses portions of the third layer of granular conductive material 28 to produce conductive elements according to the CAD model for the third layer in the circuit board. Trace 30 is fused during the third layer pass as shown in FIG. 7 with remaining portion of the third layer of granular conductive material 28, second layer of granular conductive material 24 and first layer of granular conductive material 16 unfused. As shown in FIG. 8, fusion process element 20 provides a controllable depth of fusion in the third layer of conductive material 28 during forming of trace 30 to avoid fusing any underlying material in the second or first layer of granular conductive material 24, 16. In an exemplary system employing laser sintering, power control of the laser and traverse speed of the head over the layer is employed to limit heating depth in the conductive material. For heated sintering or ultrasound, the speed of the head is determined by the power of the system and the melting temperature of the material. As an example embodiment a traversing speed of 35 mm/sec is employed. The granular conductive material in the first and second layer provide even support for the third (and any following layers) providing the correct dimensional separation of the layers and the conductive traces therein.

Figure 9:
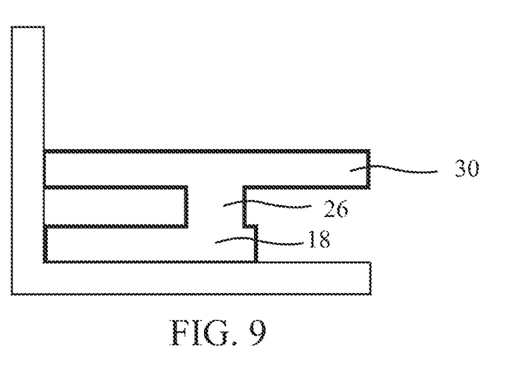
FIG. 9 is a pictorial representation of the layers with excess materials removed.
Figure 10:
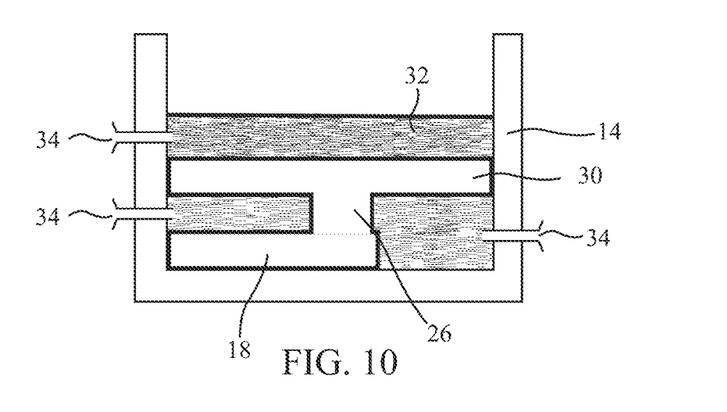
FIG. 10 is a pictorial representation of the circuit board layers with dielectric material inserted.
Figure 11:
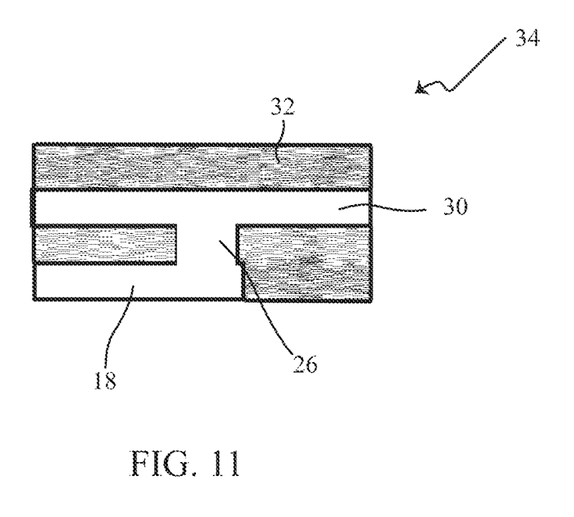
FIG. 11 is a pictorial representation of the circuit board layers with dielectric material inserted and the support frame and mold removed; and, FIG. 12 is a flow chart demonstrating the method for circuit board construction for the embodiments disclosed herein.

The process outlined with respect to FIGS. 3-8 is then repeated for as many layers as are present in the CAD model of the circuit board. As shown in FIG. 9, upon completion of the fusing process, a portion of the mold may be removed to allow unfused conductive material from all layers to be removed. A pneumatic or vibratory process may be employed for purging the unfused conductive material which may then be recycled for use. Alternatively a wet flushing process employing environmentally safe fluids may be employed and a sieving or drying process employed for recovery of the conductive material powder. The conductive elements of the circuit board, trace 18, via 26 and trace 30 are then present as shown in FIG. 9. The mold 14 may then be reassembled and a dielectric material 32 infused into the mold surrounding the conductive elements as shown in FIG. 10. Any of the current resins employed for circuit board dielectrics could be used such as GI polyimide, cyanate esther or glass-reinforced epoxy laminate such as FR4. Multiple injection ports 34 may be employed to introduce the dielectric material. A curing process is then employed to cure the dielectric material 32. The completed circuit board 34 may then be removed from the mold as shown in FIG. 11. For complex circuit boards, multiple granular conductive material purging steps and dielectric infusion steps may be employed during buildup of the complete circuit board.

Figure 12:
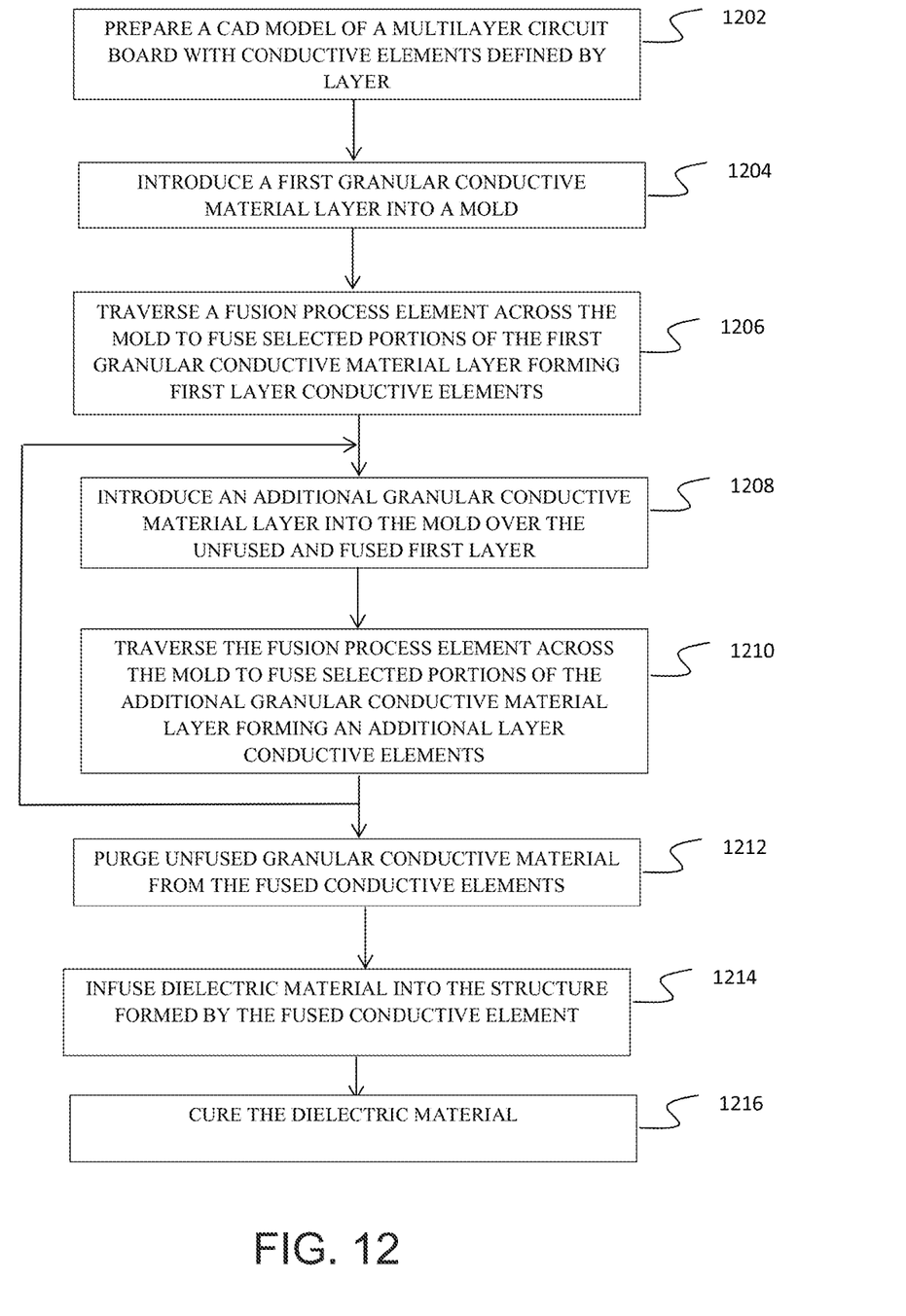

As shown in FIG. 12, the method of printed circuit board fabrication for the embodiments disclosed herein is initiated with preparation of a CAD model of a multilayer circuit board with conductive elements defined by layer, step 1202. A first granular conductive material layer is then introduced into a mold, step 1204. A fusion process element traverses the mold to fuse selected portions of the first granular conductive material layer forming first layer conductive elements, step 1206. An additional granular conductive material layer is then introduced into the mold over the unfused and fused first layer, step 1208. The fusion process element traverses the mold to fuse selected portions of the additional granular conductive material layer forming an additional layer conductive elements, step 1210. Repetition of steps 1208 and 1210 is then accomplished to complete all layers defined in the CAD model. Unfused granular conductive material is then purged from the fused conductive elements, step 1212, and dielectric material is infused into the structure formed by the fused conductive elements, step 1214. The dielectric material is then cured, step 1216 completing the circuit board.

Having now described various embodiments of the disclosure in detail as required by the patent statutes, those skilled in the art will recognize modifications and substitutions to the specific embodiments disclosed herein. Such modifications are within the scope and intent of the present disclosure as defined in the following claims.

What is claimed is:

1. A method for fabrication of a circuit board comprising:
preparing a Computer Aided Design (CAD) model of a multilayer circuit board with conductive elements defined by layer for a plurality of layers;
introducing a first granular conductive material layer into a mold;
traversing a laser sintering head across the mold to sinter selected portions of the first granular conductive material layer forming first layer conductive elements as defined by the CAD model for a first layer in the plurality of layers;
introducing an additional granular conductive material layer into the mold over the sintered selected portions of the first layer and un-sintered portions of the first layer;
traversing the laser sintering head across the mold to sinter selected portions of the additional granular conductive material layer forming additional layer conductive elements as defined by the CAD model for an additional layer in the plurality of layers, the traversing speed and laser sintering power controlled to avoid fusing of un-sintered material in the first layer;

removing un-sintered granular conductive material from the sintered first conductive elements and additional conductive layer elements, wherein the step of removing un-sintered granual conductive material comprises pneumatic purging;

infusing a dielectric material into a structure formed by the sintered first conductive elements and additional conductive layer elements to fill space from which the un-sintered granular conductive material was removed.

2. The method as defined in claim 1 further comprising curing the dielectric material.

3. The method as defined in claim 1 wherein the step of introducing an additional granular conductive material layer and the step of traversing the laser sintering head across the mold to sinter selected portions of the additional granular conductive material layer are repeated to complete all layers of the plurality of layers defined in the CAD model.

4. A method for fabrication of a circuit board comprising: preparing a Computer Aided Design (CAD) model of a multilayer circuit board with conductive elements defined by layer for a plurality of layers; introducing a first granular conductive material layer into a mold; traversing a laser sintering head across the mold to sinter selected portions of the first granular conductive material layer forming first layer conductive elements as defined by the CAD model for a first layer in the plurality of layers; introducing an additional granular conductive material layer into the mold over the sintered selected portions of the first layer and un-sintered portions of the first layer; traversing the laser sintering head across the mold to sinter selected portions of the additional granular conductive material layer forming additional layer conductive elements as defined by the CAD model for an additional layer in the plurality of layers, the traversing speed and laser sintering power controlled to avoid fusing of un-sintered material in the first layer; removing un-sintered granular conductive material from the sintered first conductive elements and additional conductive layer elements, wherein the step of removing un-sintered granular conductive material comprises vibratory purging; infusing a dielectric material into a structure formed by the sintered first conductive elements and additional conductive layer elements to fill space from which the un-sintered granular conductive material was removed.

5. The method as defined in claim 4 further comprising curing the dielectric material.

6. The method as defined in claim 4 wherein the step of introducing an additional granular conductive, material layer and the step of traversing the laser sintering head across the mold to sinter selected portions of the additional granular conductive material layer are repeated to complete all layers of the plurality of layers defined in the CAD model.

* * * * *